(12) United States Patent
Fukui et al.

(10) Patent No.: US 6,683,000 B2
(45) Date of Patent: Jan. 27, 2004

(54) SEMICONDUCTOR-DEVICE FABRICATION METHOD

(75) Inventors: Shoichi Fukui, Tokyo (JP); Takeru Matsuoka, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/228,307

(22) Filed: Aug. 27, 2002

(65) Prior Publication Data

US 2003/0082902 A1 May 1, 2003

(30) Foreign Application Priority Data

Oct. 31, 2001 (JP) .................................. P2001-333943

(51) Int. Cl.[7] .............................................. H01L 21/44
(52) U.S. Cl. ...................... 438/672; 438/629; 438/640; 438/668; 438/675
(58) Field of Search ................. 438/629, 630, 438/637, 638, 639, 640, 666, 667, 668, 669, 672, 675

(56) References Cited

U.S. PATENT DOCUMENTS

| | | | | |
|---|---|---|---|---|
| 4,818,723 A | * | 4/1989 | Yen | 438/672 |
| 5,290,358 A | * | 3/1994 | Rubloff et al. | 438/778 |
| 5,302,233 A | * | 4/1994 | Kim et al. | 438/692 |
| 5,489,552 A | * | 2/1996 | Merchant et al. | 438/629 |
| 5,698,467 A | * | 12/1997 | Sakao et al. | 438/692 |
| 5,723,367 A | * | 3/1998 | Wada et al. | 438/660 |
| 5,747,379 A | * | 5/1998 | Huang et al. | 438/629 |
| 6,191,027 B1 | * | 2/2001 | Omura | 438/637 |
| 6,221,754 B1 | * | 4/2001 | Chiou et al. | 438/629 |
| 6,333,274 B2 | * | 12/2001 | Akatsu et al. | 438/745 |
| 6,359,300 B1 | * | 3/2002 | Economikos et al. | 438/386 |
| 6,407,002 B1 | * | 6/2002 | Lin et al. | 438/713 |

FOREIGN PATENT DOCUMENTS

| | | |
|---|---|---|
| JP | 7-161703 | 6/1995 |
| JP | 9-326436 | 12/1997 |

* cited by examiner

Primary Examiner—Kevin M. Picardat
(74) Attorney, Agent, or Firm—Burns, Doane, Swecker & Mathis, LLP

(57) ABSTRACT

A semiconductor-device fabrication method includes a step of forming a contact hole in a semiconductor substrate 1 and a step of forming a conductive contact hole. The step of forming the contact hole is performed by repeating two times or more a burying step of depositing a conductive material 5 to bury the conductive material in the contact hole and an etch-back step of removing the conductive material around the contact hole by etch back.

7 Claims, 6 Drawing Sheets

SEMICONDUCTOR-DEVICE FABRICATION METHOD

BACKGROUND OF THE INVENTION

1. Field of the Invention

The present invention relates to fabrication of a semiconductor device provided with a contact hole.

2. Prior Art

In the case of a lamination-type semiconductor device constituted by laminating a plurality of layers on a semiconductor substrate, the conductivity between interconnect layers is secured by forming a very narrow contact hole on an insulating film and then by burying a conductive material in the contact hole in order to connect interconnect layer patterns of each layer to each other. For example, a conductive material is buried in a contact hole in accordance with the following steps:

- (a) An interconnect layer pattern is formed in a lower layer. Then, an insulating film is formed to form a mask pattern of a very narrow contact hole by photolithography;
- (b) Then, a very narrow contact hole is formed at a desired position of the insulating film by dry etching by using the mask pattern;
- (c) Then, tungsten, a low-resistance, high-melting-point metal, is deposited to bury it in the contact hole and to cover the surface of the circumferential insulating film;
- (d) Then, the tungsten film on the surface of the insulating film around the contact hole is removed by etch back to leave tungsten only in the desired contact hole.

The continuity with an upper-layer interconnect pattern is obtained by the contact hole, wherein the tungsten film is buried.

As a contact hole is decreased in diameter, the burying characteristic of a tungsten film by chemical vapor deposition (hereinafter called as CVD) is further deteriorated and voids (nests) more easily remain in the tungsten film in the contact hole. When etching is performed while the voids are produced, as shown in FIG. 11, an over-etched portion 59 is produced at a void portion and a substrate at the bottom of a contact hole is etched.

In this case, the following method is known: a method for improving the burying characteristic by forming a tungsten film under a reaction-rate-determination state at low deposition temperature and pressure. However, under these conditions, a throughput is lowered because of low deposition rate. Moreover, because film stress is increased, film removal occurs and a junction leak current increases when forming a film of a thickness such as 300 nm or more at which a contact hole is sufficiently filled with the film. Furthermore, when a thick film is formed, the wafer is bent, and a stage adsorption error is likely to occur. Moreover, when unevenness of the surface of the wafer excessively increases, it may not be possible to secure a focus margin when performing photolithography.

SUMMARY OF THE INVENTION

It is an object of the present invention to improve the burying characteristic by suppressing formation of voids without causing removal of a film made of a conductive material to be buried in a very narrow contact hole or to increase of a junction leak current.

In accordance with one aspect of the present invention, there is a semiconductor-device fabrication method includes a step of forming a contact hole in a semiconductor substrate and a step of forming a conductive contact hole. The step of forming the contact hole is performed by repeating two times or more a burying step of depositing a conductive material to bury the conductive material in the contact hole and an etch-back step of removing the conductive material around the contact hole by etch back.

Preferably, the conductive material may be deposited at a thickness in a range from 25 to 50% of the inner diameter of the contact hole when the burying step is performed first.

More preferably, the conductive material may be deposited at a deposition temperature in a range from 350° C. to 430° C. after the burying step is performed twice.

Further preferably, the conductive material may be deposited at a pressure in a range from 600 Pa to 6,000 Pa when the burying step is performed first.

The conductive material may be deposited at a temperature equal to or lower than deposition temperature in a last burying step after the burying step is performed twice.

The conductive material may be deposited at a pressure equal to or lower than the pressure in a last burying step after the burying step is performed twice.

The burying step may be performed by chemical vapor deposition process.

The conductive material may be tungsten.

It is an advantage of the present invention that it is possible to bury a conductive material suppressing a void in a very narrow contact hole and obtain a preferable burying characteristic. Moreover, it is possible to form a contact hole having a high conductivity.

BRIEF DESCRIPTION OF THE DRAWINGS

The present invention will become readily understood from the following description of preferred embodiment thereof made with reference to the accompanying drawings, in which like parts are designated by like reference numeral and in which.

DETAILED DESCRIPTION OF THE PREFERRED EMBODIMENTS

Semiconductor-device fabrication methods of embodiments of the present invention are described below by referring to the accompanying drawings. Members provided with the same symbol denote the same members.

A semiconductor-device fabrication method of a first embodiment of the present invention is described below by referring to FIGS. 1 to 4. In the case of the semiconductor-device fabrication method, a step of depositing a conductive material and burying the film in a contact hole and an etch-back step of removing extra conductive material around the contact hole by means of etch back are repeated a plurality of times. Thereby, it is possible to bury a conductive material suppressing voids in a very narrow contact hole and form a conductive contact hole. Moreover, a preferable burying characteristic can be thereby obtained.

Specifically, the semiconductor-device fabrication method is now described in several steps as follows.

(a) An insulating film is formed in a silicon substrate. The insulating film can be formed at a deposition temperature of approx. 680° C. by general lowpressure CVD by using tetra ethyl ortho silicate (TEOS) as a source gas.

(b) Then, a resist pattern for a very narrow contact hole is formed by photolithography.

(c) Then, a very narrow contact hole 3 is formed on the insulating film by normal dry etching by using an etching gas such as any one of $CF_4$, $C_4F_8$, and $CHF_3$ or a mixed gas obtained by adding Ar gas to these gases.

Figure 1:
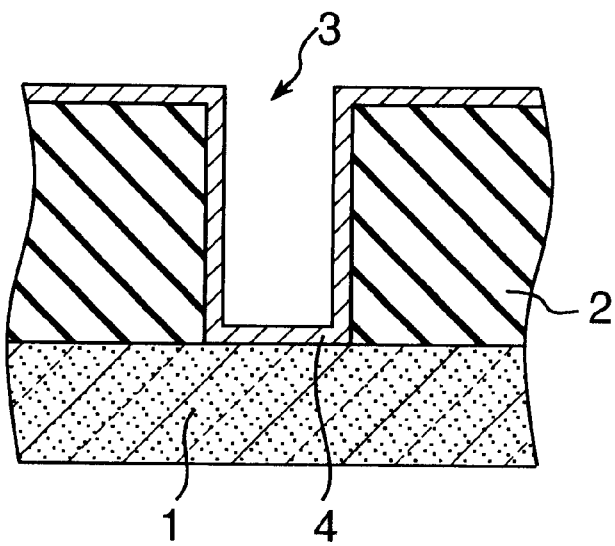
FIG. 1 is a sectional view of a contact hole obtained by depositing a barrier metal in accordance with the semiconductor-device fabrication method of a first embodiment of the present invention.
Figure 2:
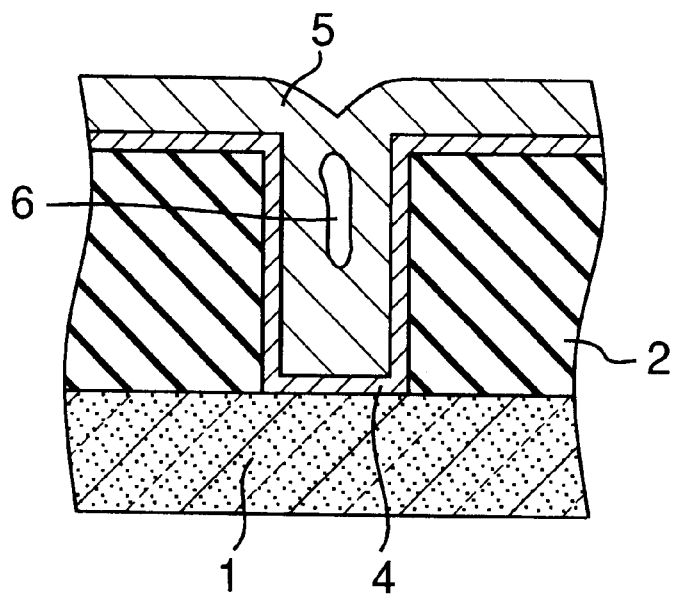
FIG. 2 is a sectional view of a contact hole in which a tungsten film is buried when the burying step is performed first in accordance with the semiconductor-device fabrication method of the first embodiment of the present invention.

(d) TiN or Ti is deposited in the contact hole 3 and on an insulating film 2 as a barrier metal 4 by sputtering or CVD as shown in FIG. 1.

(e) The first-time burying step is performed. Tungsten 5 serving as a conductive material is deposited on the barrier metal 4 in a gas atmosphere containing, for example, $WF_6$ and $H_2$ gases at a deposition temperature of 450° C. and a pressure of 10.6 kPa by CVD to bury the tungsten film 5 in the contact hole 3. In this case, when burying the tungsten film 5 in the contact hole 3 by only-one-time burying step, a void (nest) 6 may be produced in the tungsten film 5 in the contact hole 3 as shown by the sectional view in FIG. 2 and thereby, a preferable burying characteristic cannot be obtained. Therefore, to reduce the void in size, the following steps are performed.

Figure 3:
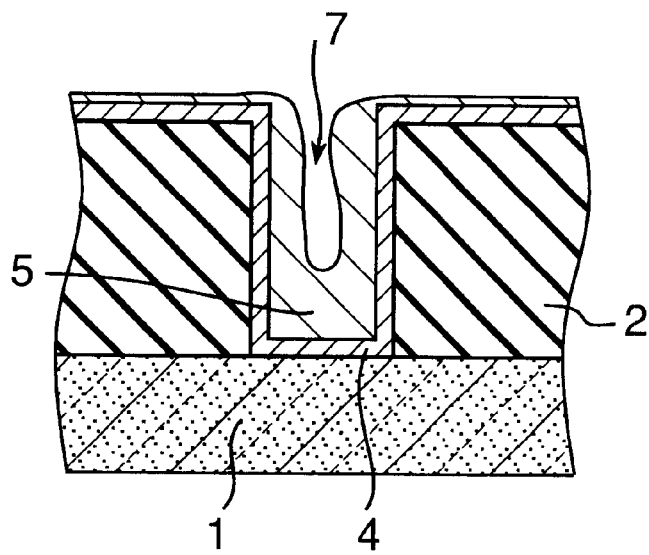
FIG. 3 is a sectional view of a contact hole to which the first-time etch back step is applied in accordance with the semiconductor-device fabrication method of the first embodiment of the present invention.

(f) Then, the first-time etch back is performed. By applying a substrate bias in the plasma containing $SF_6$ gas and performing dry etching which is a general etch-back condition, the tungsten film 5 is removed from the surface of the insulating film 2 as shown in FIG. 3. In this case, by monitoring the light emitted from the tungsten on the insulating film 2, it is possible to complete the etch back under the state of "just etch" for removing the tungsten film 5 from the surface of the insulating film 2. Moreover, it is possible to leave the tungsten film 5 only in the contact hole without etching up to the silicon substrate 1. Under the above state, it is possible to reduce the overhang portion because the opening end of the contact hole is shaved by etching as shown in FIG. 3. Moreover, as shown in FIG. 3, the upper portion of the void 6 is etched to produce a seam 7.

Figure 4:
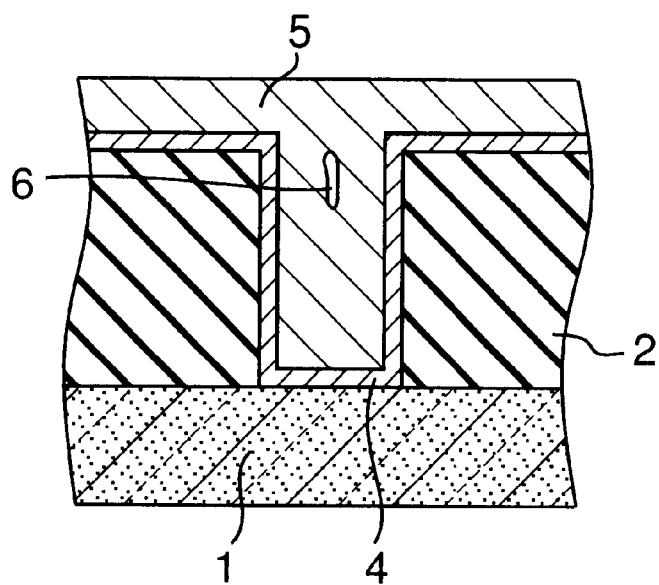
FIG. 4 is a sectional view of a contact hole in which a tungsten film is buried in the burying step is performed twice in accordance with the semiconductor-device fabrication method of the first embodiment of the present invention.

(g) Then, the second-time burying step is performed. As shown in FIG. 4, the tungsten 5 is deposited by CVD to bury the film in the contact hole. In this case, because the inner diameter of the seam 7 to be buried is smaller than that of the contact hole, it is allowed to form a tungsten film 5 thinner than the case of the first time. Deposition conditions in this case are substantially the same as the deposition conditions when the burying step is performed first except that the pressure is equal to 8,000 Pa.

(h) Moreover, the second-time etch-back step is performed. By applying etch back to the tungsten film 5, the tungsten film 5 is left only in the contact hole 3. In this case, because the tungsten film 5 formed at the second time is a thin film, it is possible to leave the tungsten film 5 only in the contact hole even if slightly over-etching the tungsten film on the insulating film 2 and keep the recess of the tungsten film 5 small.

By executing the above steps, it is possible to bury the tungsten film 5, while suppressing voids in the very narrow contact hole 3 formed in the semiconductor substrate 1, to obtain a preferable burying characteristic. Moreover, it is possible to secure a stable continuity with an upper layer. Furthermore, it is allowed to form the tungsten film 5 by CVD and further repeat a burying step of burying the tungsten film 5 in the contact hole 3 and a step of removing the extra tungsten film 5 deposited on the insulating film 2 around the contact hole 3 and leaving the tungsten film 5 only in the contact hole 3. Thereby, it is possible to decrease the void 6 in the tungsten film 5 in size.

Moreover, though the semiconductor-device fabrication method uses tungsten as a conductive material, it is also allowed to use copper, titanium, or titanium nitride TiN as the conductive material. Furthermore, it is allowed to perform a conductive-film burying step by not only the above CVD but also sputtering.

Figure 5:
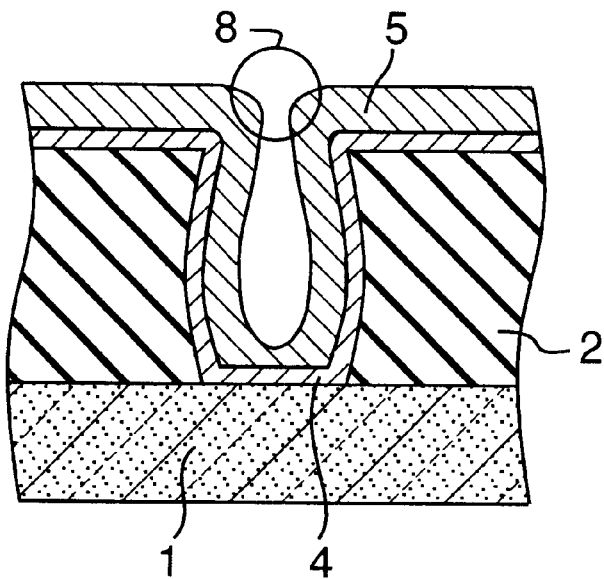
FIG. 5 is a sectional view of a contact hole in which a tungsten film is buried when the burying step is performed first in accordance with the semiconductor-device fabrication method of a second embodiment of the present invention.
Figure 6:
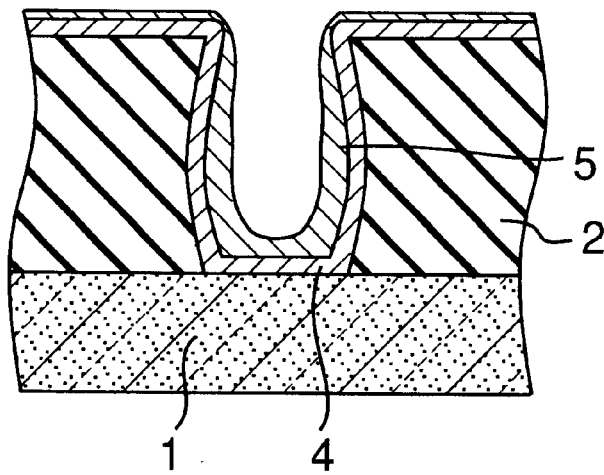
FIG. 6 is a sectional view of a contact hole to which the first-time etch-back step is applied in accordance with the semiconductor-device fabrication method of the second embodiment of the present invention.
Figure 7:
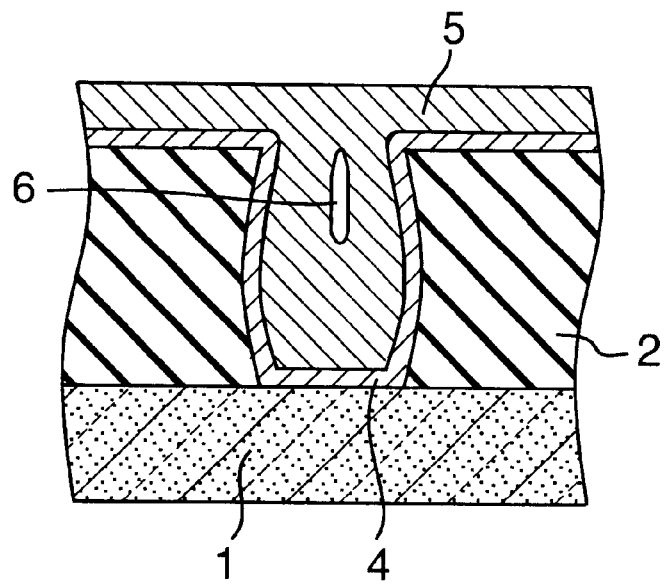
FIG. 7 is a sectional view of a contact hole in which a tungsten film is buried, when the burying step is performed twice, in accordance with the semiconductor-device fabrication method of the second embodiment of the present invention.

A semiconductor-device fabrication method of a second embodiment of the present invention is described below by referring to FIGS. 5 to 7. The semiconductor-device fabrication method is different from that of the first embodiment in that a conductive material is deposited at a thickness in a predetermined range to the inner diameter of a contact hole in the first burying step. Thereby, as shown in FIG. 5, even if the sectional form of a contact hole has an inverse taper portion at the opening like a barrel, it is possible to prevent a large void from being formed because the buried tungsten film 5 causes bridging at the opening by keeping the thickness of the formed tungsten film 5 in the above predetermined range.

Specifically, by depositing the tungsten film 5 which is a conductive material at a range between 25 and 50% of the inner diameter of the opening of a contact hole when the burying step is performed first, it is possible to prevent the tungsten film formed from the both sides of the opening end from causing bridging. In the case of this embodiment, a film is formed at a thickness of 40% of the inner diameter of the opening of a contact hole, that is, at a thickness of approx. 60 nm. Moreover, as deposition conditions in the above case, a deposition temperature is 450° C. and a pressure is 8,000 Pa. Furthermore, because the overhang portion 8 of the tungsten film 5 formed on the opening end of the contact hole 3 can be efficiently shaved in the first-time etch-back step, it is possible to form the remaining seam 7 into a shape having no overhang portion. Moreover, a void is not easily formed at and after the second-time burying step and it is possible to obtain a preferable burying characteristic. Thus, even if the sectional form of a contact hole is a barrel-like (bowing) shape having an inverse taper portion at the opening, it is possible to suppress formation of voids and obtain a preferable burying characteristic by executing the first-time burying step under a predetermined deposition condition and repeating an burying step and an etch-back step several times.

Figure 8:
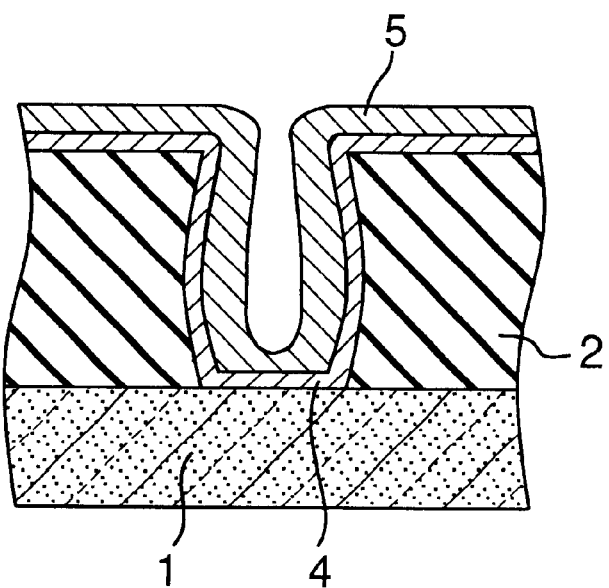
FIG. 8 is a sectional view of a contact hole in which a tungsten film is buried when the burying step is performed first in accordance with the semiconductor-device fabrication method of a third embodiment of the present invention.
Figure 9:
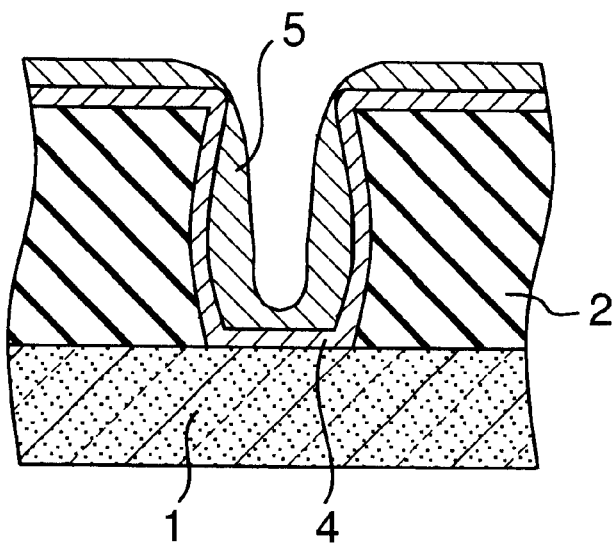
FIG. 9 is a sectional view of a contact hole to which the first-time etch-back step is applied in accordance with the semiconductor-device fabrication method of the third embodiment of the present invention.
Figure 10:
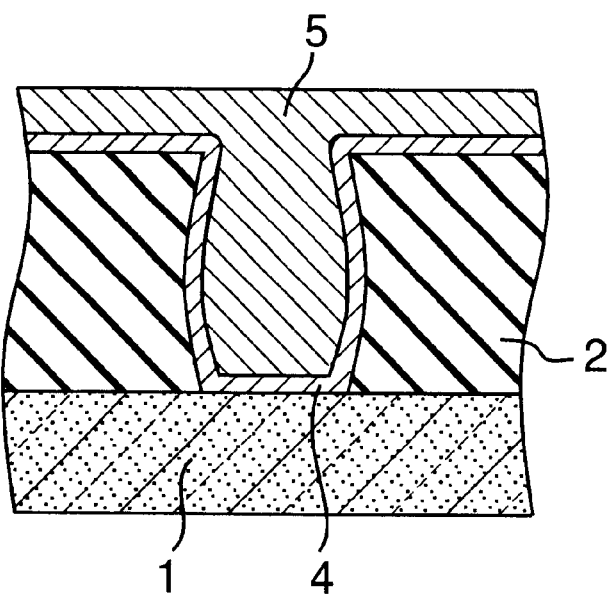
FIG. 10 is a sectional view of a contact hole in which a tungsten film is buried when the burying step is performed twice, in accordance with the semiconductor-device fabrication method of the third embodiment of the present invention.
Figure 11:
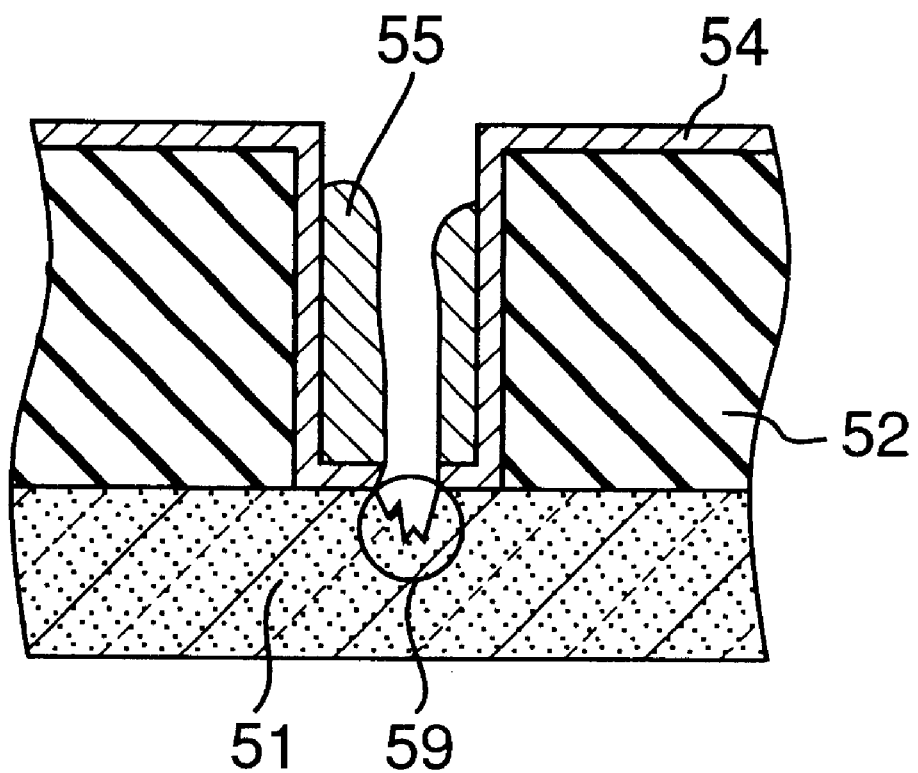
FIG. 11 is a sectional view when an overhang is produced at the bottom of a contact hole in accordance with a conventional semiconductor-device fabrication method.

A semiconductor-device fabrication method of a third embodiment of the present invention is described below by referring to FIGS. 8 to 10. The semiconductor-device fabrication method is different from that of the second embodiment in that a tungsten film is formed by CVD in predetermined ranges of a deposition temperature and a pressure as deposition conditions when the burying step is performed first to bury the film in a contact hole. Thus, by keeping a deposition temperature and a pressure in predetermined ranges as deposition conditions, it is possible to suppress occurrence of overhangs at the opening end of a contact hole and thereby, bury a conductive material having no void in and after the second-time burying step.

Specifically, it is preferable to form a tungsten film serving as a conductive material by setting a deposition temperature in a range between 350° C. and 430° C. when the burying step is performed first. It is more preferable to form the film at a deposition temperature in a range from 380° C. to 430° C. If the deposition temperature is lower than 350° C., it is impossible to obtain a sufficient uniformity of formation of a tungsten film that can be practically used. Moreover, the adhesiveness of the film is deteriorated, the film stress tends to rise, and film removal may occur. Furthermore, because the deposition rate is low, the throughput is deteriorated. For example, when forming a tungsten film having a thickness of 100 nm on an 8" wafer at 325° C. by CVD, the maximum and minimum values of the film thickness greatly fluctuate between 120 and 50 nm. Moreover, when the diameter of a hole is 0.4 μm, it is difficult to achieve an burying target between 25% and 50% of the inner diameter of the hole. Furthermore, when a temperature exceeds 430° C., the burying characteristic is particularly deteriorated in the case of a contact hole having a small inner diameter or a barrel-shaped contact hole having an inverse-taper portion at the opening.

Furthermore, a tungsten film is formed at a pressure in a range from 600 Pa to 6,000 Pa. A pressure lower than 600 Pa is not practically usable because a deposition rate is extremely lowered. When a pressure exceeds 6,000 Pa, the burying characteristic is particularly deteriorated in the case of a contact hole having a small inner diameter or a barrel-shaped contact hole having an inverse-taper portion at the opening because an overhang shape formed on the opening end of the contact hole is actualized. For example, when a tungsten film is formed on an 8" wafer at 8,000 Pa by CVD, the size of a void becomes 0.1 to 0.12 μm when the hole diameter is 0.3 μm because of a large overhang.

Therefore, the thickness difference between the thinnest portion and thickest portion of the sidewall of the hole becomes approx. 50 nm and thereby, it is difficult to achieve the burying target between 25% and 50% of the inner diameter of the hole in the burying characteristic of only the inside of the hole. When at least one of a deposition temperature and a pressure is kept in the above range as a deposition condition, it is possible to suppress occurrence of an overhang at the opening end of the contact hole. It is more preferable that both deposition temperature and pressure are kept in the above range. In the case of this embodiment, a tungsten film having a thickness of approx. 60 nm which corresponds to approx. 40% of the inner diameter of the opening of a contact hole is formed at a deposition temperature of 400° C. and a pressure of 8,000 Pa when the burying step is performed first. Moreover, it is allowed to form a tungsten film at a deposition temperature of 450° C. and a pressure of 2,000 Pa. It is more preferable to form a tungsten film at a deposition temperature of 400° C. and a pressure of 2,000 Pa.

Because the seam diameter is further smaller than the inner diameter of the contact hole in and after the second-time burying step, it is preferable to form a tungsten film under the deposition conditions in the same range as the first-time deposition conditions. Moreover, it is preferable to form a tungsten film at a deposition temperature equal to or lower than the deposition temperature in the last burying step in and after the second-time burying step. Furthermore, it is preferable to form a tungsten film at a pressure equal to or lower than the pressure when the burying step is performed first. Thereby, it is possible to obtain a preferable burying characteristic for a seam that becomes smaller whenever burying is repeated.

According to the semiconductor-device fabrication method of the present invention, an burying step of depositing a conductive material and burying the film in a contact hole and an etch-back step of removing the conductive material around the contact hole by means of etch back are repeated several times. Thereby, it is possible to bury a conductive material suppressing a void in a very narrow contact hole and obtain a preferable burying characteristic. Moreover, it is possible to form a contact hole having a high conductivity.

Moreover, according to the semiconductor-device fabrication method of the present invention, a conductive material is deposited in a range between 25% and 50% of the inner diameter of the opening of a contact hole and buried in the contact hole. Thereby, it is possible to prevent bridging at the opening end of the contact hole.

Furthermore, according to the semiconductor-device fabrication method of the present invention, because a conductive material is deposited at a deposition temperature in a predetermine range when the burying step is performed first, it is possible to suppress the occurrence of an overhang at the opening end of a contact hole.

Furthermore, according to the semiconductor-device fabrication method of the present invention, because a conductive material is deposited at a pressure in a predetermined range when the burying step is performed first, it is possible to suppress the occurrence of an overhang at the opening end of a contact hole.

Furthermore, according to the semiconductor-device fabrication method of the present invention, because a film is formed at a deposition temperature equal to or lower than the deposition temperature in the last burying step in and after the second-time burying step, it is possible to obtain a preferable burying characteristic even if a seam diameter becomes smaller than the inner diameter of a contact hole.

Furthermore, according to the semiconductor-device fabrication method of the present invention, because a film is formed at a pressure equal to or lower than the pressure in the last burying step in and after the second-time burying step, it is possible to obtain a preferable burying characteristic even if a seam diameter becomes smaller than the inner diameter of a contact hole.

Furthermore, according to the semiconductor-device fabrication method of the present invention, because an burying step is performed by CVD, it is possible to easily perform the step.

Furthermore, according to the semiconductor-device fabrication method of the present invention, because tungsten is used as a conductive material, it is possible to obtain a preferable continuity.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor-device fabrication method comprising:

forming a contact hole in a semiconductor substrate; and forming a conductive contact hole by repeating two times or more a burying step of depositing a conductive material to bury the conductive material in the contact hole and an etch-back step of removing the conductive material around the contact hole etch back, wherein the conductive material is deposited at a pressure equal to or lower than the pressure in a last burying step after the burying step is performed twice.

2. The semiconductor-device fabrication method according to claim 1, wherein the conductive material is deposited at a thickness in a range from 25 to 50% of the inner diameter of the contact hole in the contact hole when the burying step is performed first.

3. The semiconductor-device fabrication method according to claim 1, wherein the conductive material is deposited at a deposition temperature in a range from 350° C. to 430° C. when the burying step is performed first.

4. The semiconductor-device fabrication method according to claim 1, wherein the conductive material is deposited at a pressure in a range from 600 Pa to 6,000 Pa when the burying step is performed first.

5. The semiconductor-device fabrication method according to claim 1, wherein the conductive material is deposited at a temperature equal to or lower than the deposition temperature in a last burying step in and after the second-time burying step.

6. The semiconductor-device fabrication method according to claim 1, wherein the burying step is performed by chemical vapor deposition process.

7. The semiconductor-device fabrication method according to claim 1, wherein the conductive material is tungsten.

* * * * *